United States Patent
Joffe et al.

(10) Patent No.: US 10,505,339 B1
(45) Date of Patent: Dec. 10, 2019

(54) TUNING AN OPTICAL TRANSMISSION SYSTEM

(71) Applicant: ADTRAN, Inc., Huntsville, AL (US)

(72) Inventors: Daniel M. Joffe, Huntsville, AL (US); Leif Sandstrom, Madison, AL (US)

(73) Assignee: ADTRAN, Inc., Huntsville, AL (US)

( * ) Notice: Subject to any disclaimer, the term of this patent is extended or adjusted under 35 U.S.C. 154(b) by 0 days.

(21) Appl. No.: 16/132,515

(22) Filed: Sep. 17, 2018

(51) Int. Cl.
*H01S 5/00* (2006.01)
*H01S 5/024* (2006.01)
*G02B 27/09* (2006.01)
*G02B 5/20* (2006.01)

(52) U.S. Cl.
CPC .............. *H01S 5/0078* (2013.01); *G02B 5/20* (2013.01); *G02B 27/0916* (2013.01); *H01S 5/024* (2013.01)

(58) Field of Classification Search
CPC .. H01S 5/0078; H01S 3/10038; H01S 3/1306; H01S 5/06213; H01S 5/06251; H01S 5/06832; H01S 5/024; G02B 5/20; G02B 27/0916
See application file for complete search history.

(56) References Cited

U.S. PATENT DOCUMENTS

| 7,536,113 B2 * | 5/2009 | Matsui ................. H04B 10/504 398/185 |
| 7,542,683 B2 | 6/2009 | Matsui et al. |
| 2005/0169638 A1 | 8/2005 | Tayebati et al. |
| 2005/0169642 A1 | 8/2005 | Mahgerefteh et al. |
| 2005/0175355 A1 * | 8/2005 | Hauenschild ........ H04B 10/504 398/161 |
| 2005/0180474 A1 * | 8/2005 | Buchold ................... H01S 5/06 372/38.08 |
| 2013/0148680 A1 * | 6/2013 | Azadeh ................. H01S 5/0427 372/38.07 |

* cited by examiner

*Primary Examiner* — Xinning (Tom) Niu
(74) *Attorney, Agent, or Firm* — Fish & Richardson P.C.

(57) ABSTRACT

An optical transmission system includes a laser module that generates a modulated optical waveform including both amplitude and frequency modulation; and an optical shaping filter that converts at least part of the frequency modulation to additional amplitude modulation. The optical transmission system is tuned by: measuring, based on the amplitude modulation of a filtered waveform output from the optical shaping filter, an average output power of the optical shaping filter; and adjusting a temperature of the laser module to a first temperature at which a target output condition is achieved, including: adjusting the temperature of the laser module to a first target temperature at which the average output power of the filtered waveform satisfies a first output criteria, or adjusting the temperature of the laser module to a second target temperature at which the output power and extinction ratio of the filtered waveform satisfy a second output criteria.

16 Claims, 8 Drawing Sheets

TUNING AN OPTICAL TRANSMISSION SYSTEM

BACKGROUND

This document relates to optical telecommunications apparatus and methods. Data networks are being deployed and/or upgraded to provide subscribers with access to digital content. In some situations, the entities deploying these data networks will initially install network components that provide a certain level of service (e.g., speed) that is currently desired by their subscribers, and those entities will later determine whether to replace the initially installed network components to provide a higher level of service (e.g., higher speed).

SUMMARY

In general, one innovative aspect of the subject matter described in this specification can be embodied in optical transmission systems that include a laser module configured to generate a modulated optical waveform that comprises both amplitude modulation and frequency modulation; an optical shaping filter configured to convert at least part of the frequency modulation in the modulated optical waveform to additional amplitude modulation for the modulated optical waveform; and a controller comprising at least one processor configured to tune the optical transmission system by performing operations that comprise: measuring, based on the amplitude modulation of a filtered optical waveform that is output from the optical shaping filter, an average output power of the optical shaping filter; and adjusting a temperature of the laser module to a first temperature at which a target output condition is achieved, comprising: adjusting the temperature of the laser module to a first target temperature at which the average output power of the filtered optical waveform that is output from the optical shaping filter satisfies a first output criteria, or adjusting the temperature of the laser module to a second target temperature at which the output power and extinction ratio of the filtered optical waveform that is output from the optical shaping filter satisfy a second output criteria. Other implementations of this aspect include corresponding methods, computer systems, apparatus, and computer programs recorded on one or more computer storage devices, each configured to cause at least one operably connected processor to perform the actions of the methods.

Implementations may include one or more of the following features. The optical transmission system where the laser module comprises a directly modulated laser, and where the optical shaping filter is a bandpass filter configured to limit an operating bandwidth of the modulated optical waveform. The optical transmission system where the optical transmission system further comprises an optical transmitter that is configured to modulate an electrical signal that drives the laser module to generate the modulated optical waveform. The optical transmission system where adjusting the temperature of the laser module to the first target temperature or to the second target temperature comprises: determining a rate of change of the output power with respect to operating frequency or with respect to the temperature of the laser module; and adjusting the temperature of the laser module to the first target temperature or to the second target temperature at which the rate of change of the output power satisfies a first condition or a second condition, respectively. The optical transmission system where adjusting the temperature of the laser module to the first temperature at which the average output power of the optical shaping filter satisfies the first output criteria comprises: determining a reference temperature for the laser module, within a range of temperatures, at which (i) the average output power of the optical shaping filter is maximized at a maximum average output power, or (ii) a specified extinction ratio is achieved and the average output power is within a specified amount of the maximum average output power. The optical transmission system where determining the reference temperature for the laser module at which the average output power of the optical shaping filter is maximized comprises: determining, for a plurality of temperatures of the laser module within the range of temperatures, a corresponding plurality of average output powers from the optical shaping filter; and selecting, from among the plurality of temperatures, the reference temperature as corresponding to (i) a maximum average output power among the plurality of average output powers, or (ii) an average output power among the plurality of average output powers that is within the specified amount of the maximum average output power, and at which the specified extinction ratio is achieved. The optical transmission system, wherein the operations further comprise: setting the first temperature of the laser module to be offset from the reference temperature. The optical transmission system, where setting the first temperature of the laser module to be offset from the reference temperature comprises: setting the first temperature of the laser module to be offset from the reference temperature such that a frequency of a first modulation level in the modulated optical waveform is less than 5 GHz away from a center frequency of a bandpass region of the optical shaping filter. The optical transmission system, where the operations further comprise: applying a temperature dither signal to the laser module to offset the temperature of the laser module; measuring, based on an updated filtered optical waveform that is output from the optical shaping filter, an updated average output power of the optical shaping filter; and adjusting the temperature of the laser module to a second temperature at which the updated average output power of the optical shaping filter satisfies the output criteria. The optical transmission system, where the laser module is further configured to generate the modulated optical waveform having a first modulation frequency and a second modulation frequency, and where the operations further comprise: initializing the temperature of the laser module to an initial temperature at which the first modulation frequency of the laser module is aligned with the optical shaping filter, based on a center frequency of a bandpass region of the optical shaping filter.

All or part of the features described throughout this application can be implemented as a computer program product including instructions that are stored on one or more non-transitory machine-readable storage media, and that are executable on one or more processing devices. All or part of the features described throughout this application can be implemented as an apparatus, method, or electronic system that can include one or more processing devices and memory to store executable instructions to implement the stated functions.

The details of one or more embodiments of the subject matter described in this specification are set forth in the accompanying drawings and the description below. Other features, aspects, and advantages of the subject matter will become apparent from the description, the drawings, and the claims.

DETAILED DESCRIPTION

The subject matter described in this document relates to optical telecommunications systems, devices, and methods that provide tuning for an optical transmission system. In some implementations, an optical transmission system includes a laser module and an optical shaping filter that converts frequency modulation components of a waveform emitted by the laser module into additional amplitude modulation for the waveform. By aligning the frequency response characteristics of the optical shaping filter with outputs of the laser module, the optical transmission system can provide various performance advantages, including improved extinction ratio and diminished effects of frequency chirp on dispersion. Furthermore, the optical transmission system may be configured so as to maintain alignment between the optical shaping filter and the laser module, to help ensure that the above performance advantages are consistently provided despite effects of aging and temperature variations in the optical transmission system.

In some implementations, the tuning of an optical transmission system as disclosed herein may have the advantage of being configured to be performed according to simple and convergent techniques that maintain the critical frequencies of the optical shaping filter aligned with laser output frequencies. In some scenarios, implementations disclosed herein enable limiting changes in the extinction ratio of a transmitted optical waveform that would otherwise be caused by frequency drift as the optical waveform propagates through transmission media.

Figure 1:
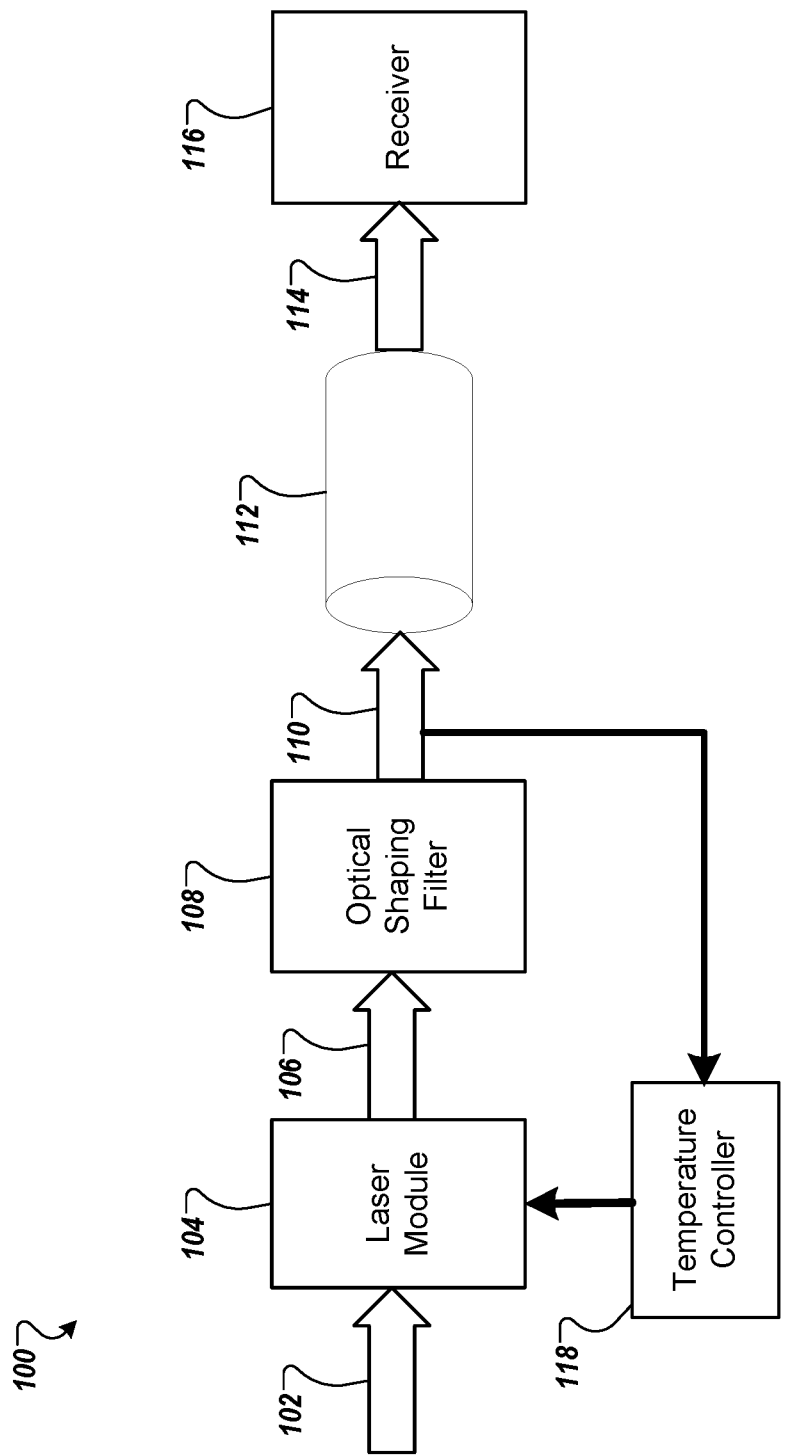
FIG. 1 is a block diagram of an example optical communication environment.

FIG. 1 is a block diagram of an example optical communication environment 100. In this example, an input signal 102 is input into a laser module 104, which outputs a modulated optical waveform 106. In some implementations, the laser module 104 may include a directly modulated laser. The input signal 102 may be any suitable type of signal that acts upon the laser module 104 to generate the modulated optical waveform 106. For example, in some implementations, the input signal 102 may be an electrical signal that includes information to be transmitted through the optical communication environment 100.

The laser module 104 may output the modulated optical waveform 106 with various modulation levels. For example, the modulated optical waveform 106 may have two modulation levels, corresponding to an information "0" and an information "1." In the scenario of amplitude modulation, the modulation levels correspond to different amplitude levels in the modulated optical waveform 106. In the scenario of frequency modulation, the modulation levels of the modulated optical waveform 106 correspond to different frequency components in the modulated optical waveform 106. In general, the laser module 104 generates the modulated optical waveform 106 with any suitable number of modulation levels representing any suitable type of information.

The modulated optical waveform 106 is then input into an optical shaping filter 108, which performs frequency-selective filtering on the modulated optical waveform 106 to output a filtered optical waveform 110. The filtered optical waveform 110 is then transmitted over a communication channel 112, which may be any suitable optical transmission medium, and is received as a received optical waveform 114 by an optical receiver 116.

The optical shaping filter 108 may be designed to perform filtering on the modulated optical waveform 106 that results in a filtered optical waveform 110 having characteristics that improve the performance of communication over the communication channel 112, as compared to transmitting the modulated optical waveform 106 by itself. For example, in the scenario of a system designed to perform amplitude-modulated communication, the optical shaping filter 108 may be configured to convert incidental frequency modulation that is present in the modulated optical waveform 106 into additional amplitude modulation. Such incidental frequency modulation may be present in the modulated optical waveform 106 due to effects of frequency chirp in the laser.

For example, if the modulated optical waveform 106 is generated by the laser module 104 to be amplitude modulated (e.g., the waveform 106 having a first amplitude representing information "0" and a second amplitude representing information "1"), then effects of frequency chirp may cause variations in the frequency profile of the modulated optical waveform 106 such that a "0" pulse and a "1" pulse are shifted to different frequencies. This can introduce incidental frequency modulation, as the information "0" is carried at a frequency that is different from a frequency at which the information "1" is carried.

To mitigate such problems, the optical shaping filter 108 may be designed to convert incidental frequency modulation (e.g., caused by frequency chirp) in the modulated optical waveform 106 into additional amplitude modulation for the modulated optical waveform 106. As such, the output of the optical shaping filter 108, namely the filtered optical waveform 110 in FIG. 1, may have improved extinction ratio and diminished effects of frequency chirp. To achieve this, the optical shaping filter 108 may be designed to have critical frequencies that are aligned with the output of the laser module 104. Further details of the alignment of the optical shaping filter 108 with the laser module 104 are discussed with reference to FIGS. 2 and 3, below.

To help ensure that the optical shaping filter 108 maintains proper alignment with the laser module 104, and therefore performs the desired filtering operation, a feedback control system may be implemented that tunes the transmission system to ensure maintaining proper operation. In the example of FIG. 1, a temperature controller 118 controls a temperature of the laser module 104 based on feedback information regarding the filtered optical waveform 110 that is output from the optical shaping filter 108. The temperature controller 118 controls the temperature of the laser module 104 so as to maintain a desired relationship of frequencies between the laser module 104 and the optical shaping filter 108. Through such control, the laser module 104 may be tuned so as to maintain desired output characteristics in the filtered optical waveform 110 despite changes to the optical communication environment 100 caused by aging and/or caused by variations in the ambient temperature.

Figure 2:
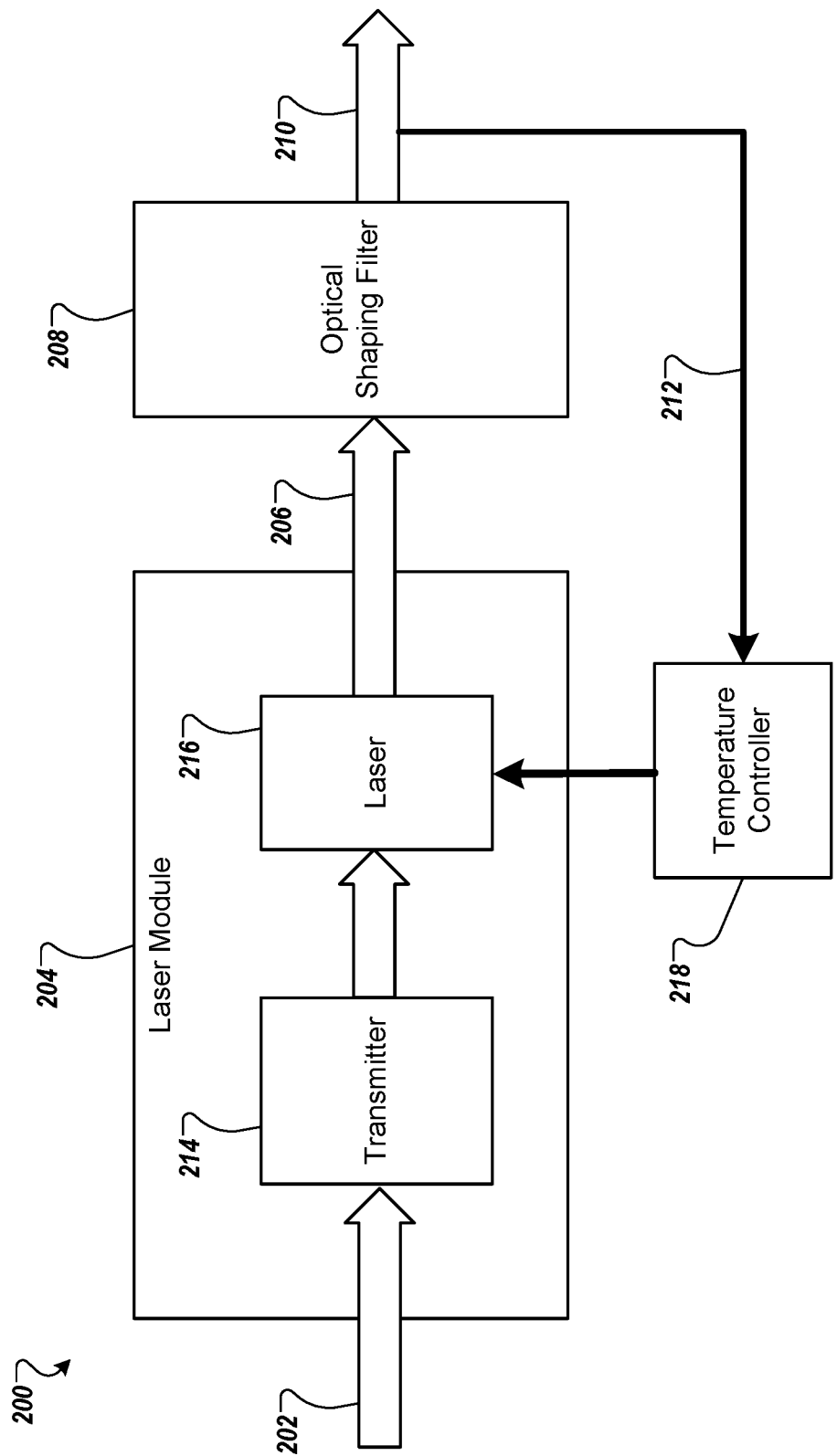
FIG. 2 is a block diagram of an example optical transmission system.

FIG. 2 is a block diagram of an example optical transmission system 200. The optical transmission system 200 includes a laser module 204, an optical shaping filter 208, and a temperature controller 218, which may be implementations of the laser module 104, the optical shaping filter 108, and the temperature controller 118 in FIG. 1.

In the optical transmission system 200, the laser module 204 includes an optical transmitter 214 and a laser 216 (e.g., a laser diode). The optical transmitter 214 receives an input signal 202, and uses the input signal 202 to drive the laser 216, which outputs a modulated optical waveform 206. For example, the optical transmitter 214 may be designed to drive the laser 216 to generate the output modulated optical waveform 206 that is amplitude-modulated with specified characteristics, such as a specified extinction ratio between amplitude-modulated levels of the waveform 206. However, in such scenarios, the modulated optical waveform 206 may also contain, in addition to amplitude modulation, incidental frequency-modulated components. Such incidental frequency modulation may be caused by effects such as frequency chirp, which causes signal components in the modulated optical waveform 206 to drift, i.e., increase or decrease, in frequency.

As an example, during the course of manufacturing, the laser 216 (e.g., a laser diode) in the laser module 204 may be designed to generate a binary amplitude-modulated optical waveform 206 having a specified extinction ratio (e.g., 4 dB) using two input currents that are sufficiently above a threshold, which may help ensure fast operation and adequate output power. The temperature of the laser 216 may be adjusted so that the frequency of the amplitude-modulated "1" component of the modulated optical waveform 206 is set to a desired frequency. Then in such scenarios, the frequency of the amplitude-modulated "0" component of the modulated optical waveform 206 may be some frequency distance away (e.g., some number of GHz lower) than the frequency of the amplitude-modulated "1" component, due to effects of frequency chirp. As a result, the modulated optical waveform 206 will have both the original amplitude modulation as well as incidental frequency modulation caused by frequency chirp.

The modulated optical waveform 206 is then input into the optical shaping filter 208, which performs filtering and outputs a filtered optical waveform 210. In some implementations, the optical shaping filter 208 may be a bandpass filter that is configured to limit an operating bandwidth of the modulated optical waveform 206.

As discussed with reference to FIG. 1, above, and as further detailed with reference to FIGS. 3A to 3C, below, if the modulated optical waveform 206 includes both amplitude modulation and frequency modulation (e.g., amplitude modulation with incidental frequency modulation), then the optical shaping filter 208 may convert at least a portion of the frequency modulation that is present in the modulated optical waveform 206 into additional amplitude modulation in the resulting filtered optical waveform 210.

In some implementations, the optical transmission system 200 may be initially configured to align the critical frequencies of the optical shaping filter 208 with the modulated optical waveform 206 that is output from the laser module 204 by controlling an angle between and the optical shaping filter 208 and the laser module 204 to be adjusted by small variations. In some implementations, the optical shaping filter 208 may be a bandpass filter. In such scenarios, for example, a frequency of the "1" component of the modulated optical waveform 206 that is output from the laser module 206 may be aligned with the center of the bandpass region of the optical shaping filter 208, which may result in minimum attenuation. The frequency of the "0" component of the modulated optical waveform 206 (which may be frequency-shifted due to incidental frequency modulation) may then be aligned to correspond to a periphery of the bandpass region of the optical shaping filter 208, and therefore may undergo more attenuation.

As a result of such alignment between the laser module 204 and the optical shaping filter 208, the filtered optical waveform 210 that is output from the optical shaping filter 208 has an increased extinction ratio that is approximately larger (as compared to the modulated optical waveform 206) by the ratio of the gains at the "1" and "0" frequencies that were induced by the optical shaping filter 208. The improved extinction ratio in the filtered optical waveform 210 can provide improved communication performance by helping a receiver (e.g., receiver 116 in FIG. 1) better distinguish between amplitude-modulated "1" and "0" signals.

However, the relationship between laser frequency and temperature may change as the laser ages. To help ensure that the proper output frequency is maintained, the temperature of the system is varied to maintain the output characteristics of the filtered optical waveform signal 210.

For example, in FIG. 2, information regarding the resulting filtered optical waveform 210 may then be provided as feedback information 212 to a controller, such as temperature controller 218. The temperature controller 218 analyzes the feedback information 212 and adjusts the temperature of the laser module 204 based on the information regarding the filtered optical waveform 210. By adjusting the temperature of the laser module 204, the temperature controller 218 changes the frequency characteristics of the modulated optical waveform 206 (relative to the optical shaping filter 208), which in turn changes the filtered optical waveform 210 that is output from the optical shaping filter 208.

In some implementations, the temperature controller 218 may adjust the temperature of the laser module 204 so that the filtered optical waveform 210 satisfies one or more output criteria. For example, in some implementations, the temperature controller 218 measures an average output power of the optical shaping filter 208, based on the amplitude modulated optical waveform 210 that is output from the optical shaping filter 208. The temperature controller 218 then adjusts a temperature of the laser module 204 so that the output of the optical shaping filter 208 satisfies output criteria.

For example, the output criteria that the temperature controller 218 strives to achieve may be that the average output power of the optical shaping filter 208 satisfies first output criteria. Then the temperature controller 218 would adjust the temperature of the laser module 204 to a first target temperature at which the average output power of the filtered optical waveform 210 that is output from the optical shaping filter 206 satisfies the first output criteria. In some implementations, the first output criteria may be maximizing the average output power of the optical shaping filter 208, or may be achieving an average output power that is slightly below maximum.

As another example, the output criteria that the temperature controller 218 strives to achieve may be that the average output power and the extinction ratio of the filtered optical waveform 210 that is output from the optical shaping filter 208 satisfy second output criteria. In some implementations, the second output criteria may be that a specified extinction ratio is achieved and that the average output power is within a specified range of the maximum average output power, based on a change in the average output power with operating frequency In some implementations, the temperature controller 218 may determine a reference temperature for the laser module 204, within a range of temperatures, at which (i) the average output power of the optical shaping filter 208 is maximized at a maximum average output power, or (ii) a specified extinction ratio is achieved and the average output power is within a specified amount of the maximum average output power.

In such implementations, the temperature controller 218 may determine the reference temperature for the laser module 204 at which the average output power of the optical shaping filter 208 is maximized by various techniques. For example, the temperature controller 218 may determine, for a plurality of temperatures of the laser module within the range of temperatures, a corresponding plurality of average output powers from the optical shaping filter 208. The temperature controller 218 may then select, from among the plurality of temperatures, the reference temperature as corresponding to (i) a maximum average output power among the plurality of average output powers, or (ii) an average output power among the plurality of average output powers that is within the specified amount of the maximum average output power, and at which the specified extinction ratio is achieved.

Once the reference temperature is determined, the temperature controller 218 may set the temperature of the laser module 204 to be the reference temperature, or may set the temperature of the laser module 204 to be offset from the reference temperature by a certain temperature difference. As a result of controlling the temperature, the frequency properties of the modulated optical waveform 206 may be controlled and aligned relative to the filtering frequencies of the optical shaping filter 208.

For example, the maximum average output power from the optical shaping filter 208 (achieved at the reference temperature) may correspond to a frequency of a "1" modulation level of the modulated optical waveform being aligned with the center frequency of the bandpass region of the optical shaping filter 208. In such scenarios, the temperature controller 218 may set the temperature of the laser module 204 to be offset from the reference temperature such that a frequency of a first modulation level (e.g., a the "1" modulation component) in the modulated optical waveform 206 is offset from a center frequency of a bandpass region of the optical shaping filter 208. For example, in some implementations, the offset in frequency from the center frequency of the optical shaping filter 208 may be less than 5 GHz (or some other appropriate/specified offset). In some implementations, the offset in frequency from the center frequency of the optical shaping filter 208 may be less than 1 GHz.

As such, the alignment between the frequency properties of the modulated optical waveform 206 and the optical shaping filter 208 may be achieved by analyzing the average output power of the optical shaping filter 208.

Once aligned, to help assure that the optical transmission system 200 remains tuned, in some implementations, the temperature controller 218 may further apply a temperature dither signal to the temperature of the laser module 204 and perform re-alignment. In particular, the temperature controller 218 may measure, based on an updated filtered optical waveform 210 that is output from the optical shaping filter 208 after applying the temperature dither signal to the laser module 204, an updated average output power of the optical shaping filter 208. The temperature controller 218 may then adjust the temperature of the laser module 204 to a second temperature at which the updated average output power of the optical shaping filter 208 satisfies the same output criteria as described before.

As such, by monitoring the average output power of the optical shaping filter 208 and adjusting the temperature of the laser module 204 such that the average output power achieves an output criteria, the optical transmission system 200 enables maintaining the optical transmission system to be tuned to achieve improved extinction ratio and diminished effects of frequency chirp.

Figure 3A:
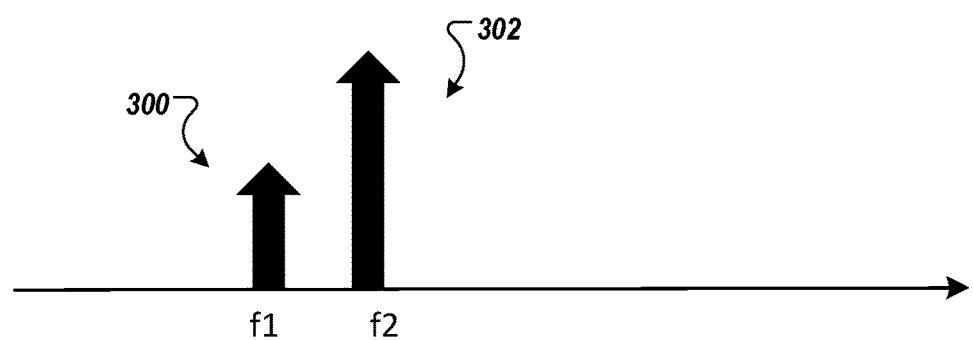
FIGS. 3A to 3C illustrate examples of aligning the frequency characteristics of an optical shaping filter with outputs of a laser module for tuning an optical transmission system.
Figure 3B:
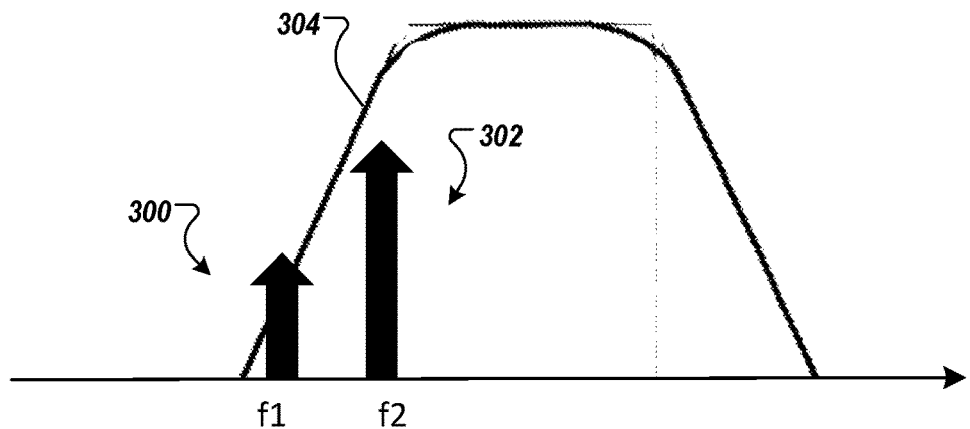
Figure 3C:
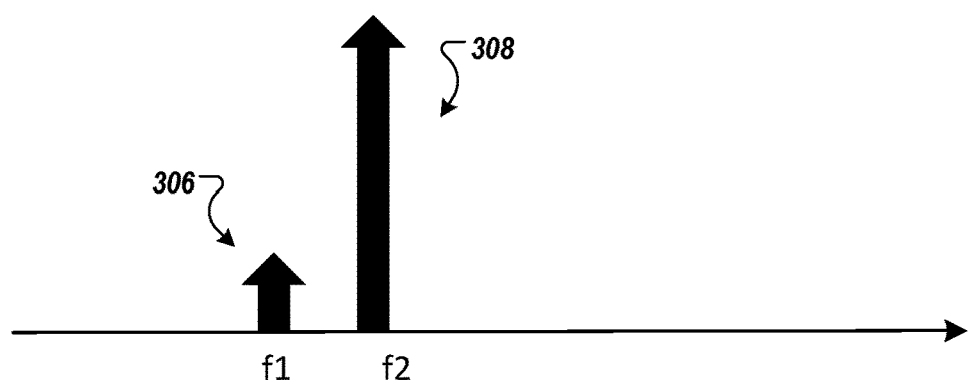

FIGS. 3A to 3C illustrate examples of aligning the frequency characteristics of an optical shaping filter (e.g., optical shaping filter 108 in FIG. 1 or 208 or FIG. 2) with outputs of a laser module (e.g., laser module 104 in FIG. 1 or 204 in FIG. 2) for tuning an optical transmission system.

FIG. 3A illustrates two possible components of an output of an amplitude-modulated laser module (e.g., laser module 104 in FIG. 1) that has incidental frequency modulation. In this example, a first modulation signal 300 represents a first modulation level (e.g., information "0" corresponding to a smaller amplitude) and a second modulation signal 302 represents a second modulation level (e.g., information "1" corresponding to a larger amplitude). The two signals may represent two different components of a modulated optical waveform (e.g., 106 in FIG. 1) that is output from a laser module.

In addition to the amplitude modulation in the signals 300 and 302 in FIG. 3A, non-ideal effects such as frequency chirp may additional cause incidental frequency modulation. Such frequency chirp may cause the first modulation signal 300 and the second modulation 302 to occupy different frequencies. For example, as shown in FIG. 3A, the first modulation signal 300 occupies a first frequency f1, and the second modulation signal 302 occupies a second frequency f2. Such differences in frequency component in a waveform caused by frequency chirp may be disadvantageous to communication systems.

FIG. 3B shows an example of mitigating such effects of frequency chirp by using an optical shaping filter (e.g., optical shaping filter 108 in FIG. 1). The optical shaping filter is configured to convert incidental frequency modulation (e.g., caused by chirp) in a modulated optical waveform into additional amplitude modulation that further enhances existing amplitude modulation in the modulated waveform.

As shown in FIG. 3B, in some implementations the frequency spectrum 304 representing the filtering characteristics of an optical shaping filter may have a bandpass shape. Just as one example, in some implementations, the optical shaping filter may be a 7th order Bessel bandpass filter that has an attenuation of 3 dB at 6 GHz above or 6 GHz below a center frequency, and an attenuation of about 30 dB at 18 GHz below and 18 GHz above the center frequency. As another example, in some implementations, the optical shaping filter may be a 2nd-order bandpass filter with 20 GHz full-width half-maximum (FWHM). In general, the optical shaping filter may be implemented from among a wide variety of suitable bandpass characteristics. The bandpass region of the optical shaping filter may be centered about an optical carrier frequency, for example 185 THz.

In the example of a 20 GHz FWHM 2nd order bandpass optical shaping filter, the filtering characteristics may be equivalent to a 10 GHz lowpass filter centered about zero frequency (DC). In such scenarios, adding a pole at 10 GHz (e.g., to a 10 Gb transmitter) would shape the transmitted pulses in a somewhat rounded manner, but would not be a significant impairment.

The modulated signals 300 and 302 that are output from the laser module (e.g., laser module 104 in FIG. 1) may be aligned with the frequency response 304 of the optical shaping filter such that the "1" frequency f2 of the second signal 302 is aligned near the center of the filter response 304. Then, due to presence of frequency chirp, the "0" frequency f1 of the first signal 300 will be moved a certain frequency distance away from the second signal 302. In the example of FIG. 3B, the "0" frequency f1 is 10 GHz below the "1" frequency f2 (e.g., 10 GHz of chirp).

Due to the filtering characteristic 304 of the optical shaping filter, the signal 300 at frequency f1 is attenuated at the edge of the filter response 304, while the signal 302 at frequency f2 is enhanced near the center of the filter response 304. As an example, for a 20 GHz FWHM optical shaping filter, the frequency response 304 of the optical shaping filter would further enhance the amplitude distinction between signals 300 and 302 and, in this example, add another 3 dB to the extinction ratio of the signal.

As another example, if there is 15 GHz of frequency chirp (so that f1 and f2 are separated by 15 GHz), then the additional extinction ratio provided by the optical shaping filter would be $$AER = 10\log\left(\left(\frac{f\,chirp}{f3dB}\right)^2 + 1\right) = 10\log\left(\left(\frac{15}{10}\right)^2 + 1\right) = 5.119 \text{ dB}$$

Laser operating frequency is typically proportional to the laser operating current, and therefore frequency chirp typically increases with the native extinction ratio that is generated by the laser. For example, driving a laser to about 5 dB of extinction ratio can generate 15 GHz of chirp. In such scenarios, an optical shaping filter can provide more than 10 dB of total extinction ratio.

FIG. 3C shows an example of the resulting filtered optical waveform (e.g., filtered optical waveform 110 or 210 in FIG. 1 or 2). As such, when the frequency response 304 of the optical shaping filter is properly aligned with the frequency modulation properties of a modulated signal (e.g., with frequencies f1 and f2), then the resulting filtered optical waveform can have improved extinction ratio.

In some implementations, even higher extinction ratio enhancements may be achieved by aligning the "1" frequency (i.e., frequency f2 in FIGS. 3A to 3C) a little below the center of the bandpass response 304 of the optical shaping filter, as shown in FIG. 3B. Selecting the appropriate alignment of the frequency properties of a modulated waveform with an optical shaping filter will be discussed further below.

Such alignment between the modulation frequencies of a modulated waveform and an optical shaping filter can provide various advantages, such as: increasing average output power from the optical transmitter, increasing extinction ratio, increasing OMA, and/or mitigating effects of dispersion.

As a specific example, the FWHM (full-width half-maximum) bandwidth, which is the distance in Hz between upper and lower 3 dB frequencies of the filter response may be 20 GHz. The center frequency of the bandpass filter, f0, may be 187.7 THz. The chirp frequency, fc, is equal to the difference between the frequency of "1"s and "0"s in an optical waveform. The frequency of the laser when outputting a "1" may be denoted as f1. In this example, the equations would apply:

$$MSR(f, fo, Q) := \frac{(f \cdot fo)^2}{[Q \cdot (fo^2 - f^2)]^2 + (f \cdot fo)^2} \quad \text{Magnitude squared response of filter}$$

$$P0(Pavg, ERdB) := \frac{2 \cdot Pavg}{10^{\frac{ERdB}{10}} + 1}$$

$$P1(Pavg, ERdB) := P0(Pavg, ERdB) - 10^{\frac{ERdB}{10}}$$

$$PavgOutDB(f1, fc, fo, Q, Pavg, ERdB) := 10 \cdot \log\left(\frac{P0(Pavg, ERdB) \cdot MSR(f1 - fc, fo, Q) + P1(Pavg, ERdB) \cdot MSR(f1, fo, Q)}{2}\right)$$

The equations above define the filter response, the power of a "0" signal, the power of a "1" signal, and the average output power in dB. In addition, the following equations define the OMA, the extinction ratio of the optical transmitter, and the extinction ratio enhancement (referred to as "contrast") provided by the optical shaping filter, and also defines the filter parameters:

$$OMA(f1, fc, fo, Q, Pavg, ERdB) := \frac{P1(Pavg, ERdB) \cdot MSR(f1, fo, Q) -}{P0(Pavg, ERdB) \cdot MSR(f1 - fc, fo, Q)}$$

$$OMADB(f1, fc, fo, Q, Pavg, ERdB) := 10 \cdot \log(OMA(f1, fc, fo, Q, Pavg, ERdB))$$

$$EROutDB(f1, fc, fo, Q, ERdB) := 10 \cdot \log\left[\frac{(P1(1, ERdB) \cdot MSR(f1, fo, Q))}{(P0(1, ERdB) \cdot MSR(f1 - fc, fo, Q))}\right]$$

$$\text{Contrast}(f1, fc, fo, Q) := 10 \cdot \log\left(\frac{MSR(f1, fo, Q)}{MSR(f1 - fc, fo, Q)}\right)$$

$$Pavg := 5 \quad fo : 187.7 \cdot 10^{12} \quad FWHM := 20 \cdot 10^9 \quad Q := \frac{fo}{FWHM} = 9.385 \times 10^3$$

From the previous discussion, in some implementations, tuning an optical transmission system may involve adjusting the temperature of a laser module (e.g., laser module 204 in FIG. 2) to find the maximum average output power from the optical shaping filter (e.g., optical shaping filter 208 in FIG. 2), and dithering the temperature of the laser module to assure that a desired maximum output power was achieved. In some implementations, that point may be provided by the zero derivative of average output power of the optical shaping filter (Pout) versus temperature of the laser module (T). Changes in the temperature of the laser module (T) may correspond to changes in the frequency offset of a "1" modulation signal (e.g., signal 302 in FIG. 3) away from a center frequency of the optical shaping filter. As such, the operating point may also be provided by the zero derivative of average output power of the optical shaping filter versus frequency offset, $\Delta$Pout/$\Delta$f.

Figure 4:
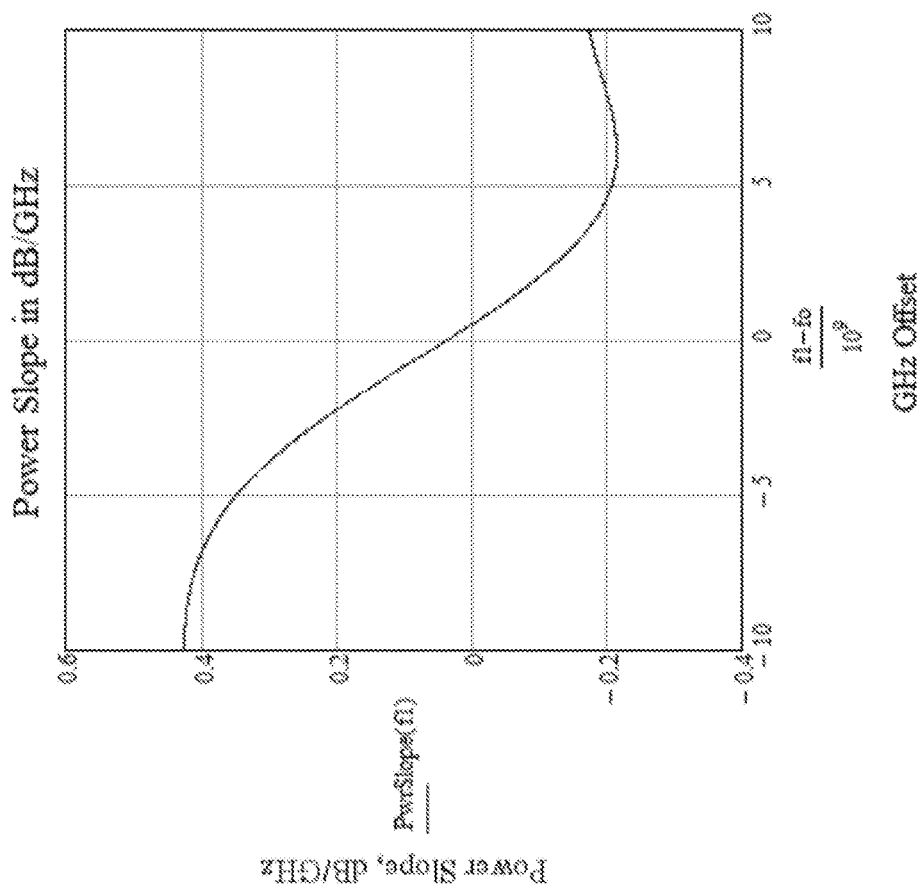
FIG. 4 is a graph showing an example of power slope as a function of the offset frequency in a system that tunes an optical transmission system.

However, as shown in FIG. 4, in some implementations, it may be advantageous to implement the system where the slope $\Delta$Pout/$\Delta$f is slightly positive. FIG. 4 is a graph showing an example of power slope as a function of the offset frequency (in dB/GHz) in a system that tunes an optical transmission system. From this example, we see that the system could easily maintain a slope of 0.1 or 0.2 dB/GHz to stabilize the operating frequency, assuming that the filter frequency changes slowly with time as compared to the laser's operating frequency. As such, a slight offset between a "1" modulation signal (e.g., signal 302 in FIG. 3) away from a center frequency of the optical shaping filter may yield greater average output power from the optical shaping filter (e.g., optical shaping filter 208 in FIG. 2).

As such, the optical shaping filter takes advantage of frequency chirp to enhance the distinction between different amplitude levels in a modulated waveform, and thus increases the extinction ratio of the waveform.

As discussed above, the power-frequency relationship of FIG. 4 can be related to temperature changes of a laser module (e.g., laser module 204 in FIG. 2). For example, a typical laser may change frequency as a function of temperature at the rate of −100 GHz/7 C, or about −14 GHz/C. In such scenarios, maintaining a frequency within plus or minus 1 GHz would involve resolving the laser temperature to within 0.07 C. For example, if the desired slope is approximately 0.2 dB/GHz, and the df/dT=−1 GHz/0.07 C, then the ideal slope can be obtained by:

$$0.2 \frac{dB}{GHz} \cdot \frac{-1 \text{ GHz}}{0.07 \text{ C.}} = -2.86 \frac{dB}{C.}$$

Figure 5:
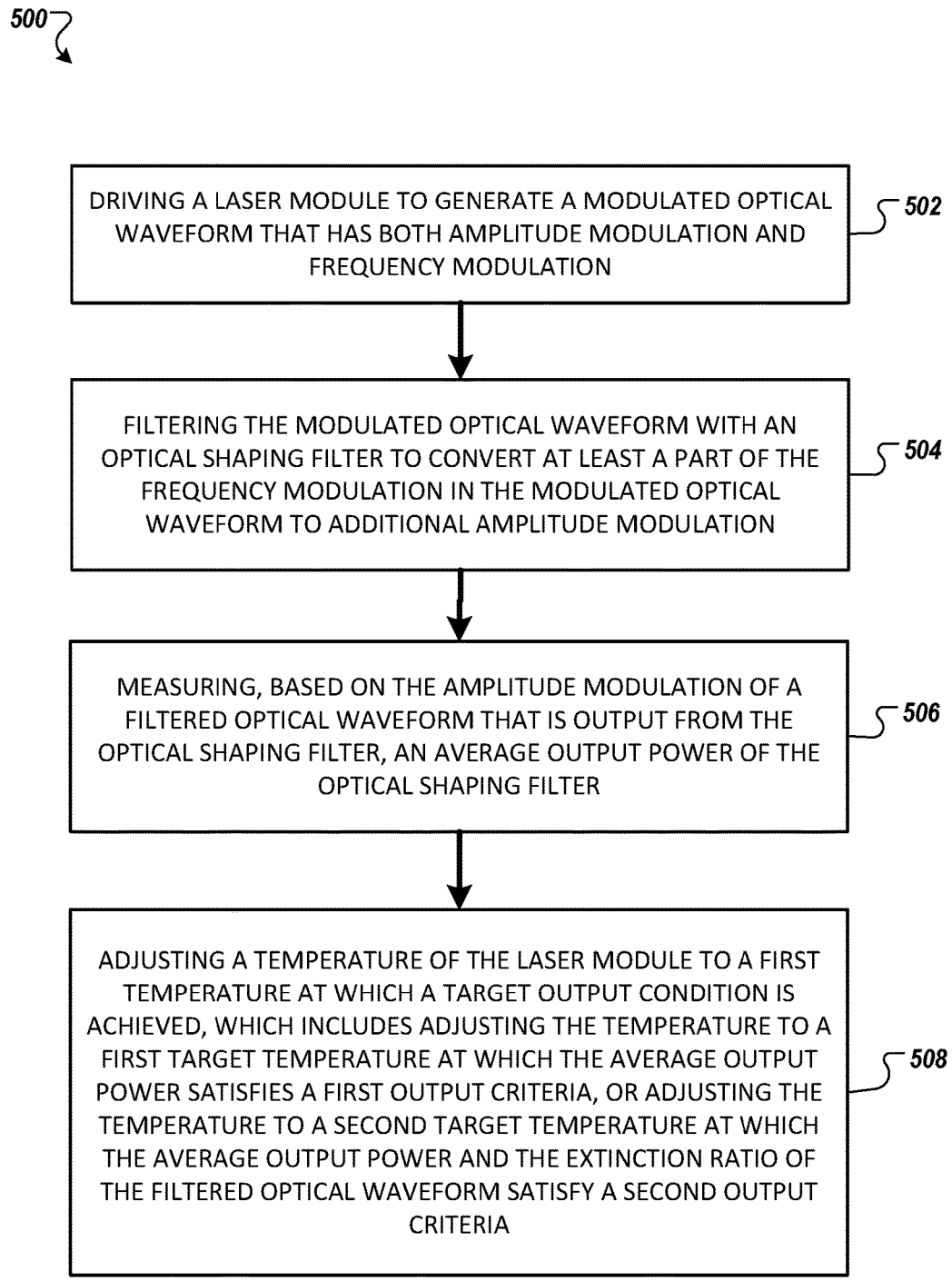
FIG. 5 is a flowchart illustrating an example method of tuning an optical transmission system.

FIG. 5 is a flow chart of an example process 500 for enabling tuning of an optical transmission system. Operations of the process 500 can be implemented, for example, using components of the optical transmission system, including a laser module and an optical shaping filter, as described above in FIGS. 1 and 2:

The tuning process 500 includes driving the laser module to generate a modulated optical waveform that includes both amplitude modulation and frequency modulation (502). As discussed above, the modulated optical waveform may be an amplitude-modulated waveform with incidental frequency modulation that is caused by effects of frequency chirp.

The tuning process 500 further includes filtering the modulated optical waveform with the optical shaping filter to convert at least part of the frequency modulation in the modulated optical waveform to additional amplitude modulation for the modulated optical waveform (504). In some implementations, the optical shaping filter is a bandpass filter configured to limit an operating bandwidth of the modulated optical waveform, as discussed in detail above.

The tuning process 500 further includes measuring, based on the amplitude modulation of a filtered optical waveform that is output from the optical shaping filter, an average output power of the optical shaping filter (506).

The tuning process 500 further includes adjusting a temperature of the laser module to a first temperature at which a target output condition is achieved (508). In some implementations, adjusting the temperature of the laser module to a first temperature at which the target output condition is achieved includes: (i) adjusting the temperature of the laser module to a first target temperature at which the average output power of the filtered optical waveform that is output from the optical shaping filter satisfies a first output criteria, or (ii) adjusting the temperature of the laser module to a second target temperature at which the average output power and extinction ratio of the filtered optical waveform that is output from the optical shaping filter satisfy a second output criteria, based on a change in the average output power as a function of operating frequency.

In some implementations, the adjustment of the temperature can include determining a reference temperature for the laser module, within a range of temperatures, at which (i) the average output power of the optical shaping filter is maximized at a maximum average output power, or (ii) a specified extinction ratio is achieved and the average output power is within a specified amount of the maximum average output power. The reference temperature can be determined, for example, by determining, for a plurality of temperatures of the laser module within the range of temperatures, a corresponding plurality of average output powers from the optical shaping filter; and selecting, from among the plurality of temperatures, the reference temperature as corresponding to (i) a maximum average output power among the plurality of average output powers, or (ii) an average output power among the plurality of average output powers that is within the specified amount of the maximum average output power, and at which the specified extinction ratio is achieved.

In some implementations, the temperature of the laser module can be set at an offset from the reference temperature, as discussed above. For example, the offset temperature can be a temperature at which a frequency of a first modulation level in the modulated optical waveform is less than 5 GHz (or some other appropriate amount) away from a center frequency of a bandpass region of the optical shaping filter.

In some implementations, the tuning process can include further operations. For example, the temperature of the laser module can be initialized to an initial temperature at which a modulation frequency of the laser module is aligned with the optical shaping filter. In some situations, a temperature dither signal can be applied to the laser module to offset the temperature of the laser module. Then, an updated average output power of the optical shaping filter can be measured for an updated filtered optical waveform that is output from the optical shaping filter. In turn, the temperature of the laser module can be adjusted to a second temperature at which the updated average output power of the optical shaping filter satisfies the output criteria, so as to maintain the tuning of the laser module over time and changes in conditions.

Figure 6:
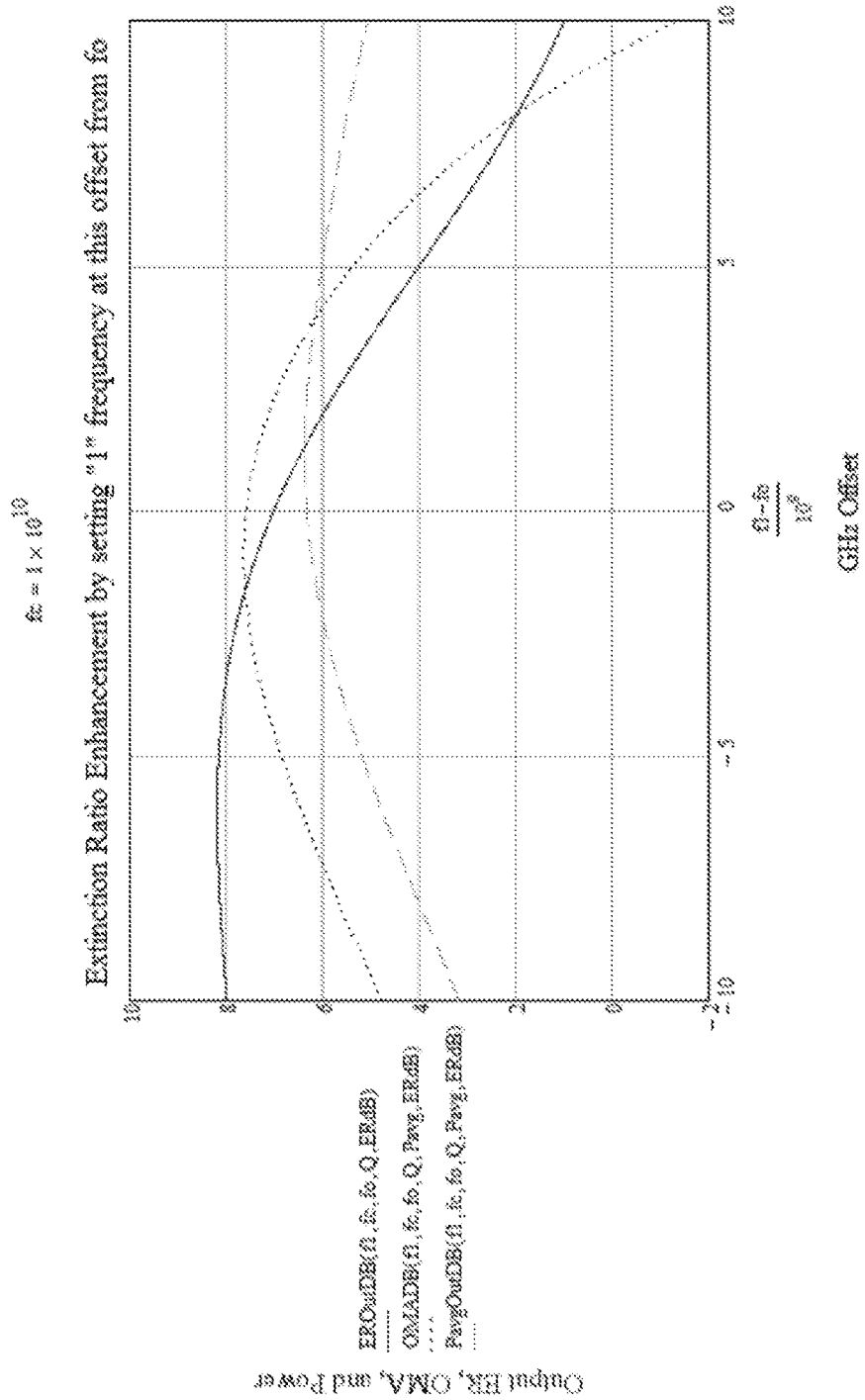
FIG. 6 is a graph showing an example of variations in extinction ratio as a function of offset frequency in a system that tunes an optical transmission system.

FIG. 6 is a graph showing an example of variations in extinction ratio as a function of offset frequency in a system that tunes an optical transmission system. As shown, in the scenario of 10 GHz of chirp and 4 dB of native extinction ratio in the laser, the optical shaping filter can provide up to 8.2 dB in extinction ratio. To further increase extinction ratio at the output of the optical shaping filter, the native extinction ratio of the laser can be increased to increase the chirp to fc=14 GHz. As such, increased chirp (caused by higher native extinction ratio in the laser) can be leveraged by the optical shaping filter to enhance the extinction ratio in the transmitter optical waveform.

Figure 7:
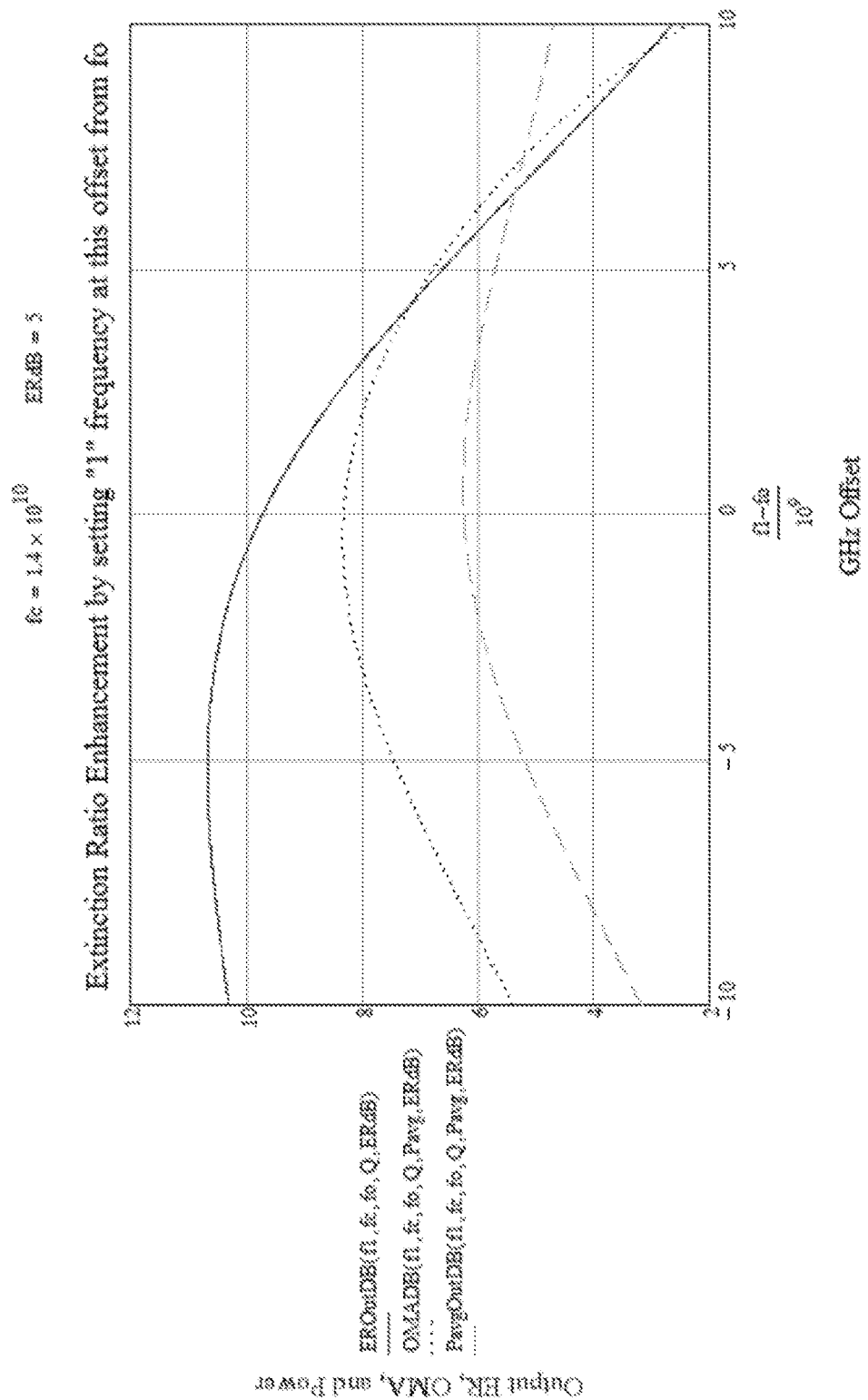
FIG. 7 is a graph showing another example of variations in extinction ratio as a function of offset frequency in a system that tunes an optical transmission system.

FIG. 7 is a graph showing another example of variations in extinction ratio as a function of offset frequency in a system that tunes an optical transmission system. In this example, the system can be designed to yield even higher extinction ratio enhancement. For example, given 14 GHz of chirp and 5 dB of native extinction ratio in the laser, the maximum OMA occurs at an offset of −0.46 GHz. This also occurs just a little below where the average output power from the optical shaping filter is maximized, at an offset of −0.24 GHz. Both of these have at least 10 dB of enhanced extinction ratio provided by the optical shaping filter, illustrating that operating just below the maximum average output power point may be advantageous in some scenarios.

Figure 8:
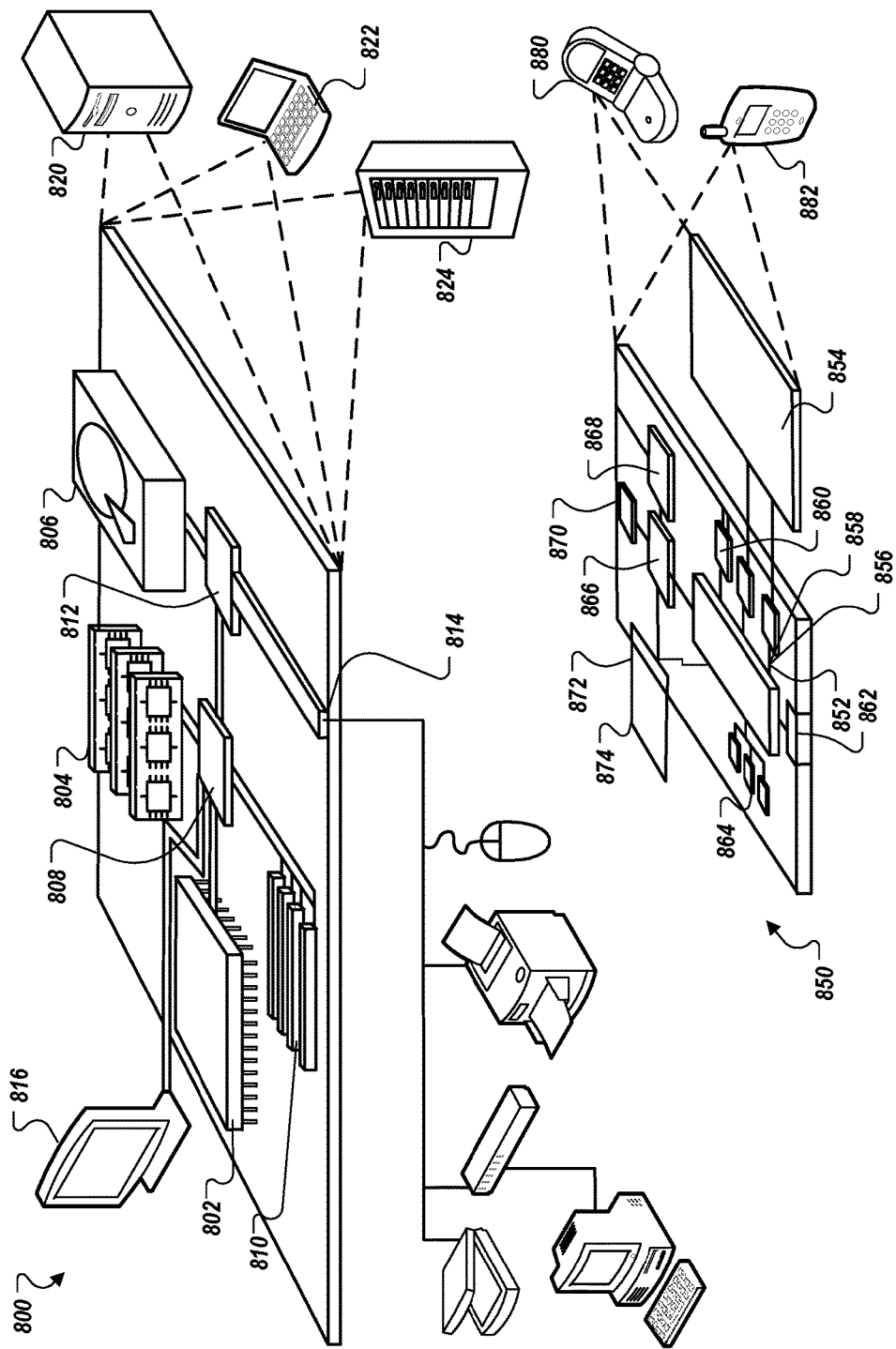
FIG. 8 is a diagram illustrating an example of a computing system that may be used to implement one or more components of a system that performs tuning for an optical transmission system.

FIG. 8 is a diagram illustrating an example of a computing system 800 that may be used to implement one or more components of a system that performs tuning of an optical transmission system.

The computing system includes computing device 800 and a mobile computing device 850 that can be used to implement the techniques described herein. For example, one or more parts of the optical communication environment 100 in FIG. 1 could be an example of the system 800 described here, such as a computer system, devices that access information, or a server that accesses or stores information.

The computing device 800 is intended to represent various forms of digital computers, such as laptops, desktops, workstations, personal digital assistants, servers, blade servers, mainframes, and other appropriate computers. The mobile computing device 850 is intended to represent various forms of mobile devices, such as personal digital assistants, cellular telephones, smart-phones, mobile embedded radio systems, radio diagnostic computing devices, and other similar computing devices. The components shown here, their connections and relationships, and their functions, are meant to be examples only, and are not meant to be limiting.

The computing device 800 includes a processor 802, a memory 804, a storage device 806, a high-speed interface 808 connecting to the memory 804 and multiple high-speed expansion ports 810, and a low-speed interface 812 connecting to a low-speed expansion port 814 and the storage device 806. Each of the processor 802, the memory 804, the storage device 806, the high-speed interface 808, the high-speed expansion ports 810, and the low-speed interface 812, are interconnected using various busses, and may be mounted on a common motherboard or in other manners as appropriate. The processor 802 can process instructions for execution within the computing device 800, including instructions stored in the memory 804 or on the storage device 806 to display graphical information for a GUI on an external input/output device, such as a display 816 coupled to the high-speed interface 808. In other implementations, multiple processors and/or multiple buses may be used, as appropriate, along with multiple memories and types of memory. In addition, multiple computing devices may be connected, with each device providing portions of the operations (e.g., as a server bank, a group of blade servers, or a multi-processor system). In some implementations, the processor 802 is a single-threaded processor. In some implementations, the processor 802 is a multi-threaded processor. In some implementations, the processor 802 is a quantum computer.

The memory 804 stores information within the computing device 800. In some implementations, the memory 804 is a volatile memory unit or units. In some implementations, the memory 804 is a non-volatile memory unit or units. The memory 804 may also be another form of computer-readable medium, such as a magnetic or optical disk.

The storage device 806 is capable of providing mass storage for the computing device 800. In some implementations, the storage device 806 may be or include a computer-readable medium, such as a floppy disk device, a hard disk device, an optical disk device, or a tape device, a flash memory or other similar solid-state memory device, or an array of devices, including devices in a storage area network or other configurations. Instructions can be stored in an information carrier. The instructions, when executed by one or more processing devices (for example, processor 802), perform one or more methods, such as those described above. The instructions can also be stored by one or more storage devices such as computer- or machine-readable mediums (for example, the memory 804, the storage device 806, or memory on the processor 802). The high-speed interface 808 manages bandwidth-intensive operations for the computing device 800, while the low-speed interface 812 manages lower bandwidth-intensive operations. Such allocation of functions is an example only. In some implementations, the high-speed interface 808 is coupled to the memory 804, the display 816 (e.g., through a graphics processor or accelerator), and to the high-speed expansion ports 810, which may accept various expansion cards (not shown). In the implementation, the low-speed interface 812 is coupled to the storage device 806 and the low-speed expansion port 814. The low-speed expansion port 814, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 800 may be implemented in a number of different forms, as shown in the figure. For example, it may be implemented as a standard server 820, or multiple times in a group of such servers. In addition, it may be implemented in a personal computer such as a laptop computer 822. It may also be implemented as part of a rack server system 824. Alternatively, components from the computing device 800 may be combined with other components in a mobile device (not shown), such as a mobile computing device 850. Each of such devices may include one or more of the computing device 800 and the mobile computing device 850, and an entire system may be made up of multiple computing devices communicating with each other.

The mobile computing device 850 includes a processor 852, a memory 864, an input/output device such as a display 854, a communication interface 866, and a transceiver 868, among other components. The mobile computing device 850 may also be provided with a storage device, such as a micro-drive or other device, to provide additional storage. Each of the processor 852, the memory 864, the display 854, the communication interface 866, and the transceiver 868, are interconnected using various buses, and several of the components may be mounted on a common motherboard or in other manners as appropriate.

The processor 852 can execute instructions within the mobile computing device 850, including instructions stored in the memory 864. The processor 852 may be implemented as a chip set of chips that include separate and multiple analog and digital processors. The processor 852 may provide, for example, for coordination of the other components of the mobile computing device 850, such as control of user interfaces, applications run by the mobile computing device 850, and wireless communication by the mobile computing device 850.

The processor 852 may communicate with a user through a control interface 858 and a display interface 856 coupled to the display 854. The display 854 may be, for example, a TFT (Thin-Film-Transistor Liquid Crystal Display) display or an OLED (Organic Light Emitting Diode) display, or other appropriate display technology. The display interface 856 may include appropriate circuitry for driving the display 854 to present graphical and other information to a user. The control interface 858 may receive commands from a user and convert them for submission to the processor 852. In addition, an external interface 862 may provide communication with the processor 852, so as to enable near area communication of the mobile computing device 850 with other devices. The external interface 862 may provide, for example, for wired communication in some implementations, or for wireless communication in other implementations, and multiple interfaces may also be used.

The memory 864 stores information within the mobile computing device 850. The memory 864 can be implemented as one or more of a computer-readable medium or media, a volatile memory unit or units, or a non-volatile memory unit or units. An expansion memory 874 may also be provided and connected to the mobile computing device 850 through an expansion interface 872, which may include, for example, a SIMM (Single In Line Memory Module) card interface. The expansion memory 874 may provide extra storage space for the mobile computing device 850, or may also store applications or other information for the mobile computing device 850. Specifically, the expansion memory 874 may include instructions to carry out or supplement the processes described above, and may include secure information also. Thus, for example, the expansion memory 874 may be provide as a security module for the mobile computing device 850, and may be programmed with instructions that permit secure use of the mobile computing device 850. In addition, secure applications may be provided via the SIMM cards, along with additional information, such as placing identifying information on the SIMM card in a non-hackable manner.

The memory may include, for example, flash memory and/or NVRAM memory (non-volatile random access memory), as discussed below. In some implementations, instructions are stored in an information carrier such that the instructions, when executed by one or more processing devices (for example, processor 852), perform one or more methods, such as those described above. The instructions can also be stored by one or more storage devices, such as one or more computer- or machine-readable mediums (for example, the memory 864, the expansion memory 874, or memory on the processor 852). In some implementations, the instructions can be received in a propagated signal, for example, over the transceiver 868 or the external interface 862.

The mobile computing device 850 may communicate wirelessly through the communication interface 866, which may include digital signal processing circuitry where necessary. The communication interface 866 may provide for communications under various modes or protocols, such as GSM voice calls (Global System for Mobile communications), SMS (Short Message Service), EMS (Enhanced Messaging Service), or MMS messaging (Multimedia Messaging Service), CDMA (code division multiple access), TDMA (time division multiple access), PDC (Personal Digital Cellular), WCDMA (Wideband Code Division Multiple Access), CDMA2000, or GPRS (General Packet Radio Service), LTE, 5G/6G cellular, among others. Such communication may occur, for example, through the transceiver 868 using a radio frequency. In addition, short-range communication may occur, such as using a Bluetooth, Wi-Fi, or other such transceiver (not shown). In addition, a GPS (Global Positioning System) receiver module 870 may provide additional navigation- and location-related wireless data to the mobile computing device 850, which may be used as appropriate by applications running on the mobile computing device 850.

The mobile computing device 850 may also communicate audibly using an audio codec 860, which may receive spoken information from a user and convert it to usable digital information. The audio codec 860 may likewise generate audible sound for a user, such as through a speaker, e.g., in a handset of the mobile computing device 850. Such sound may include sound from voice telephone calls, may include recorded sound (e.g., voice messages, music files, etc.) and may also include sound generated by applications operating on the mobile computing device 850.

The mobile computing device 850 may be implemented in a number of different forms, as shown in the figure. For example, it may be implemented as a cellular telephone 880. It may also be implemented as part of a smart-phone 882, personal digital assistant, or other similar mobile device.

The term "system" as used in this disclosure may encompass all apparatus, devices, and machines for processing data, including by way of example a programmable processor, a computer, or multiple processors or computers. A processing system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, executable logic, or code) can be written in any form of programming language, including compiled or interpreted languages, or declarative or procedural languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Computer readable media suitable for storing computer program instructions and data include all forms of non-volatile or volatile memory, media and memory devices, including by way of example semiconductor memory devices, e.g., EPROM, EEPROM, and flash memory devices; magnetic disks, e.g., internal hard disks or removable disks or magnetic tapes; magneto optical disks; and CD-ROM and DVD-ROM disks. The processor and the memory can be supplemented by, or incorporated in, special purpose logic circuitry. Sometimes a server is a general-purpose computer, and sometimes it is a custom-tailored special purpose electronic device, and sometimes it is a combination of these things.

Implementations can include a back end component, e.g., a data server, or a middleware component, e.g., an application server, or a front end component, e.g., a client computer having a graphical user interface or a Web browser through which a user can interact with an implementation of the subject matter described is this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The features described can be implemented in digital electronic circuitry, or in computer hardware, firmware, software, or in combinations of them. The apparatus can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

While this disclosure contains many specific implementation details, these should not be construed as limitations on the scope of any invention or of what may be claimed, but rather as descriptions of features that may be specific to particular implementations of particular inventions. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

What is claimed is:

1. An optical transmission system comprising:
a laser module configured to generate a modulated optical waveform that comprises both amplitude modulation and frequency modulation;
an optical shaping filter configured to convert at least part of the frequency modulation in the modulated optical waveform to additional amplitude modulation for the modulated optical waveform; and
a controller comprising at least one processor configured to tune the optical transmission system by performing operations that comprise:
measuring, based on the amplitude modulation of a filtered optical waveform that is output from the optical shaping filter, an average output power of the optical shaping filter; and
adjusting a temperature of the laser module to a first temperature at which a target output condition is achieved, comprising:
adjusting the temperature of the laser module to a first target temperature at which the average output power of the filtered optical waveform that is output from the optical shaping filter satisfies a first output criteria, or
adjusting the temperature of the laser module to a second target temperature at which the output power and extinction ratio of the filtered optical waveform that is output from the optical shaping filter satisfy a second output criteria, wherein adjusting the temperature of the laser module to the first temperature at which the average output power of the optical shaping filter satisfies the first output criteria comprises:
determining a reference temperature for the laser module, within a range of temperatures, at which (i) the average output power of the optical shaping filter is maximized at a maximum average output power, or (ii) a specified extinction ratio is achieved and the average output power is within a specified amount of the maximum average output power, and wherein determining the reference temperature for the laser module at which the average output power of the optical shaping filter is maximized comprises:
determining, for a plurality of temperatures of the laser module within the range of temperatures, a corresponding plurality of average output powers from the optical shaping filter; and
selecting, from among the plurality of temperatures, the reference temperature as corresponding to (i) a maximum average output power among the plurality of average output powers, or (ii) an average output power among the plurality of average output powers that is within the specified amount of the maximum average output power, and at which the specified extinction ratio is achieved.

2. An optical transmission system comprising:
a laser module configured to generate a modulated optical waveform that comprises both amplitude modulation and frequency modulation;
an optical shaping filter configured to convert at least part of the frequency modulation in the modulated optical waveform to additional amplitude modulation for the modulated optical waveform; and
a controller comprising at least one processor configured to tune the optical transmission system by performing operations that comprise:
measuring, based on the amplitude modulation of a filtered optical waveform that is output from the optical shaping filter, an average output power of the optical shaping filter; and
adjusting a temperature of the laser module to a first temperature at which a target output condition is achieved, comprising:
adjusting the temperature of the laser module to a first target temperature at which the average output power of the filtered optical waveform that is output from the optical shaping filter satisfies a first output criteria, or adjusting the temperature of the laser module to a second target temperature at which the output power and extinction ratio of the filtered optical waveform that is output from the optical shaping filter satisfy a second output criteria, wherein adjusting the temperature of the laser module to the first temperature at which the average output power of the optical shaping filter satisfies the first output criteria comprises:

determining a reference temperature for the laser module, within a range of temperatures, at which (i) the average output power of the optical shaping filter is maximized at a maximum average output power, or (ii) a specified extinction ratio is achieved and the average output power is within a specified amount of the maximum average output power, and wherein the operations further comprise setting the first temperature of the laser module to be offset from the reference temperature.

3. The optical transmission system of claim 2, wherein setting the first temperature of the laser module to be offset from the reference temperature comprises:

setting the first temperature of the laser module to be offset from the reference temperature such that a frequency of a first modulation level in the modulated optical waveform is less than 5 GHz away from a center frequency of a bandpass region of the optical shaping filter.

4. An optical transmission system comprising:

a laser module configured to generate a modulated optical waveform that comprises both amplitude modulation and frequency modulation;

an optical shaping filter configured to convert at least part of the frequency modulation in the modulated optical waveform to additional amplitude modulation for the modulated optical waveform; and a controller comprising at least one processor configured to tune the optical transmission system by performing operations that comprise:

measuring, based on the amplitude modulation of a filtered optical waveform that is output from the optical shaping filter, an average output power of the optical shaping filter; and adjusting a temperature of the laser module to a first temperature at which a target output condition is achieved, comprising:

adjusting the temperature of the laser module to a first target temperature at which the average output power of the filtered optical waveform that is output from the optical shaping filter satisfies a first output criteria, or adjusting the temperature of the laser module to a second target temperature at which the output power and extinction ratio of the filtered optical waveform that is output from the optical shaping filter satisfy a second output criteria;

applying a temperature dither signal to the laser module to offset the temperature of the laser module;

measuring, based on an updated filtered optical waveform that is output from the optical shaping filter, an updated average output power of the optical shaping filter; and adjusting the temperature of the laser module to a second temperature at which the updated average output power of the optical shaping filter satisfies the output criteria.

5. The optical transmission system of claim 4, wherein the laser module comprises a directly modulated laser, and wherein the optical shaping filter is a bandpass filter configured to limit an operating bandwidth of the modulated optical waveform.

6. The optical transmission system of claim 5, wherein the optical transmission system further comprises a transmitter that is configured to modulate an electrical signal that drives the laser module to generate the modulated optical waveform.

7. The optical transmission system of claim 4, wherein adjusting the temperature of the laser module to the first target temperature or to the second target temperature comprises:

determining a rate of change of the output power with respect to operating frequency or with respect to the temperature of the laser module; and adjusting the temperature of the laser module to the first target temperature or to the second target temperature at which the rate of change of the output power satisfies a first condition or a second condition, respectively.

8. The optical transmission system of claim 4, wherein the laser module is further configured to generate the modulated optical waveform having a first modulation frequency and a second modulation frequency, and wherein the operations further comprise:

initializing the temperature of the laser module to an initial temperature at which the first modulation frequency of the laser module is aligned with the optical shaping filter, based on a center frequency of a bandpass region of the optical shaping filter.

9. A method of tuning an optical transmission system that comprises a laser module and an optical shaping filter, the method comprising:

driving the laser module to generate a modulated optical waveform that comprises both amplitude modulation and frequency modulation;

filtering the modulated optical waveform with the optical shaping filter to convert at least part of the frequency modulation in the modulated optical waveform to additional amplitude modulation for the modulated optical waveform;

measuring, based on the amplitude modulation of a filtered optical waveform that is output from the optical shaping filter, an average output power of the optical shaping filter; and adjusting a temperature of the laser module to a first temperature at which a target output condition is achieved, comprising:

adjusting the temperature of the laser module to a first target temperature at which the average output power of the filtered optical waveform that is output from the optical shaping filter satisfies a first output criteria, or adjusting the temperature of the laser module to a second target temperature at which the average output power and extinction ratio of the filtered optical waveform that is output from the optical shaping filter satisfy a second output criteria, wherein adjusting the temperature of the laser module to the first temperature such that the average output power of the optical shaping filter satisfies the first output criteria comprises:

determining a reference temperature for the laser module, within a range of temperatures, at which (i) the average output power of the optical shaping filter is maximized at a maximum average output power, or (ii) a specified extinction ratio is achieved and the average output power is within a specified amount of the maximum average output power, and wherein determining the reference temperature for the laser module at which the average output power of the optical shaping filter is maximized comprises:

determining, for a plurality of temperatures of the laser module within the range of temperatures, a corresponding plurality of average output powers from the optical shaping filter; and selecting, from among the plurality of temperatures, the reference temperature as corresponding to (i) a maximum average output power among the plurality of average output powers, or (ii) an average output power among the plurality of average output powers that is within the specified amount of the maximum average output power, and at which the specified extinction ratio is achieved.

10. A method of tuning an optical transmission system that comprises a laser module and an optical shaping filter, the method comprising:

driving the laser module to generate a modulated optical waveform that comprises both amplitude modulation and frequency modulation;

filtering the modulated optical waveform with the optical shaping filter to convert at least part of the frequency modulation in the modulated optical waveform to additional amplitude modulation for the modulated optical waveform;

measuring, based on the amplitude modulation of a filtered optical waveform that is output from the optical shaping filter, an average output power of the optical shaping filter; and adjusting a temperature of the laser module to a first temperature at which a target output condition is achieved, comprising:

adjusting the temperature of the laser module to a first target temperature at which the average output power of the filtered optical waveform that is output from the optical shaping filter satisfies a first output criteria, or adjusting the temperature of the laser module to a second target temperature at which the average output power and extinction ratio of the filtered optical waveform that is output from the optical shaping filter satisfy a second output criteria; and setting the first temperature of the laser module to be offset from the reference temperature.

11. The method of claim 10, wherein setting the first temperature of the laser module to be offset from the reference temperature comprises:

setting the first temperature of the laser module to be offset from the reference temperature such that a frequency of a first modulation level in the modulated optical waveform is less than 5 GHz away from a center frequency of a bandpass region of the optical shaping filter.

12. A method of tuning an optical transmission system that comprises a laser module and an optical shaping filter, the method comprising:

driving the laser module to generate a modulated optical waveform that comprises both amplitude modulation and frequency modulation;

filtering the modulated optical waveform with the optical shaping filter to convert at least part of the frequency modulation in the modulated optical waveform to additional amplitude modulation for the modulated optical waveform;

measuring, based on the amplitude modulation of a filtered optical waveform that is output from the optical shaping filter, an average output power of the optical shaping filter; and adjusting a temperature of the laser module to a first temperature at which a target output condition is achieved, comprising:

adjusting the temperature of the laser module to a first target temperature at which the average output power of the filtered optical waveform that is output from the optical shaping filter satisfies a first output criteria, or adjusting the temperature of the laser module to a second target temperature at which the average output power and extinction ratio of the filtered optical waveform that is output from the optical shaping filter satisfy a second output criteria;

applying a temperature dither signal to the laser module to offset the temperature of the laser module;

measuring, based on an updated filtered optical waveform that is output from the optical shaping filter, an updated average output power of the optical shaping filter; and adjusting the temperature of the laser module to a second temperature at which the updated average output power of the optical shaping filter satisfies the output criteria.

13. The method of claim 12, wherein the laser module comprises a directly modulated laser, and wherein the optical shaping filter is a bandpass filter configured to limit an operating bandwidth of the modulated optical waveform.

14. The method of claim 13, wherein a transmitter is configured to modulate an electrical signal that drives the laser module to generate the modulated optical waveform.

15. The method of claim 12, wherein adjusting the temperature of the laser module to the first target temperature or to the second target temperature comprises:

determining a rate of change of the output power with respect to operating frequency or with respect to the temperature of the laser module; and adjusting the temperature of the laser module to the first target temperature or to the second target temperature at which the rate of change of the output power satisfies a first condition or a second condition, respectively.

16. The method of claim 12, further comprising:

initializing the temperature of the laser module to an initial temperature at which a modulation frequency of the laser module is aligned with the optical shaping filter, based on a center frequency of a bandpass region of the optical shaping filter.

* * * * *